United States Patent
Muntz et al.

[11] Patent Number: 5,938,102
[45] Date of Patent: *Aug. 17, 1999

[54] HIGH SPEED JET SOLDERING SYSTEM

[76] Inventors: Eric Phillip Muntz, 1560 E. California Bl., Pasadena, Calif. 91106; Melissa E. Orme-Marmarelis, 26 Whistler Ct., Irvine, Calif. 92715; Gerald C. Pham-Van-Diep, 1500 Priscilla La., Newport Beach, Calif. 92660; Robert J. Balog, 41 Village Way, North Attleboro, Mass. 02760

[ * ] Notice: This patent issued on a continued prosecution application filed under 37 CFR 1.53(d), and is subject to the twenty year patent term provisions of 35 U.S.C. 154(a)(2).

[21] Appl. No.: 08/583,641

[22] Filed: Jan. 5, 1996

Related U.S. Application Data

[63] Continuation-in-part of application No. 08/533,508, Sep. 25, 1995, abandoned.

[51] Int. Cl.⁶ .................................................. B23K 3/00
[52] U.S. Cl. ........................... 228/102; 228/262; 228/254; 228/256; 347/68
[58] Field of Search ................................. 347/37, 73, 77, 347/76, 68; 228/254, 256, 261, 102, 262

[56] References Cited

U.S. PATENT DOCUMENTS

| | | |
|---|---|---|
| 3,222,776 | 12/1965 | Kawecki . |
| 3,570,721 | 3/1971 | Cushman . |
| 3,588,906 | 6/1971 | Brimer et al. ............................ 347/77 |
| 3,826,224 | 7/1974 | Baker et al. . |
| 3,916,042 | 10/1975 | Grietens . |
| 4,075,636 | 2/1978 | Galetto et al. ............................ 347/77 |
| 4,126,711 | 11/1978 | Marlow ..................................... 427/15 |
| 4,303,108 | 12/1981 | Akers et al. . |
| 4,347,521 | 8/1982 | Teumer ..................................... 347/77 |
| 4,530,464 | 7/1985 | Yamamoto et al. . |
| 4,551,731 | 11/1985 | Lewis et al. ............................. 346/75 |
| 4,575,730 | 3/1986 | Logan et al. ............................. 347/77 |
| 4,597,420 | 7/1986 | Schoenthaler et al. . |
| 4,828,886 | 5/1989 | Hieber . |
| 5,024,255 | 6/1991 | Watanabe et al. . |
| 5,193,738 | 3/1993 | Hayes ...................................... 228/254 |
| 5,229,016 | 7/1993 | Hayes et al. . |
| 5,320,250 | 6/1994 | La . |

(List continued on next page.)

FOREIGN PATENT DOCUMENTS

| | | |
|---|---|---|
| 63-004657 | 1/1988 | Japan . |
| WO 96/09121 | 3/1996 | WIPO . |

OTHER PUBLICATIONS

Declaration of Robert J. Balag.
U.S. Application Serial No. 08/533,511.
U.S. Application Serial No. 08/533,509.
U.S. Application Serial No. 08/533,510.
U.S. Application Serial No. 08/533,515.
Orme, "Precision Droplet Streamline Manufacturing", Proceedings of the International Conference On Advanced Synthesis of Engineered Structural Materials, Aug.31–Sep. 2, 1992, San Francisco, CA pp. 237–244.
Orme, "Rapid Solidification Materials Synthesis With Nano–Liter Droplets", SAE Technical Paper Series, Aerotech '93, Costa Mesa, CA, Sep. 27–30, 1993, pp. 113–118.

(List continued on next page.)

*Primary Examiner*—Samuel M. Heinrich
*Attorney, Agent, or Firm*—Mintz, Levin, Cohn, Ferris, Glovsky and Popeo, P.C.

[57] ABSTRACT

Depositing a selected pattern of solder droplets onto a substrate on which one or more electronic components are to be mounted, the substrate being mounted on a substrate support and moved relative to a solder ejector along a scan axis, the droplets being deflected along a fan axis that is transverse to the scan axis by selectively applying a charge and passing the charged droplets through an electric field.

22 Claims, 3 Drawing Sheets

Microfiche Appendix Included
(1 Microfiche, 28 Pages)

U.S. PATENT DOCUMENTS

| | | |
|---|---|---|
| 5,377,902 | 1/1995 | Hayes . |
| 5,377,961 | 1/1995 | Smith et al. . |
| 5,506,385 | 4/1996 | Murakami et al. . |
| 5,507,327 | 4/1996 | Ziegler . |

OTHER PUBLICATIONS

Hayes et al., "Application of Ink Jet Technology to Microelectronic Packaging", ISHM '89 Proceedings Proceedings, Maryland, pp. 627–634.

Priest et al., "Liquid Metal–Jetting: Its Application To SMT", Journal of SMT, Oct. 1993, pp. 4–10.

Wallace, "Automated Electronic Circuit Manufactuirng Using Ink–Jet Technology", Transactions of the ASME, vol. 111, pp. 108–111, Jun. 1989.

Priest et al., Liquid Metal Jetting Technology: Application Issues For Hybrid Technology, The International Journal of Microcircuits and Electornic Packaging, vol. 17, No. 3, Third Quarter 1994, pp. 219–227.

Orme, "A Novel Technique of Rapid Solidification Net–Form Materials Synthesis", Journal of Materials Engineering and Performance, vol. 2, No. 3, Jun. 1993, pp. 399–405.

HIGH SPEED JET SOLDERING SYSTEM

This application is a continuation-in-part of U.S. Ser. No. 08/533,508, filed on Sep. 25, 1995, now abandoned, the disclosure of which is hereby incorporated by reference.

This application includes a microfiche appendix (28 pages); and replaces pages 15–40 with the attached microfiche appendix.

BACKGROUND OF THE INVENTION

This invention relates to a jet soldering system.

Various soldering schemes have been developed for bonding semiconductor integrated circuit (IC) chips to a substrate (e.g., a printed circuit board). In some schemes, a semiconductor IC chip is bonded to a substrate by applying a small solder bump to the bottom surface of the chip, aligning the solder bump with a bond pad on the surface of the substrate, and heating the solder bump until it reflows. In some other schemes, solder bumps are applied to bonding pads on a substrate; afterwards, electronic components are bonded to the substrate by positioning the components over the solder bumps and by heating and reflowing the solder bumps. Some schemes bond IC chips to a patterned layer of solder created by applying a thin layer of solder paste to a substrate through holes in a stencil, leaving a selected solder pattern on the substrate. Recently, solder jet systems have been proposed for depositing solder droplets onto a substrate in a selected pattern. Such systems include a solder droplet ejector, which may eject solder droplets on-demand or continuously. In one proposed continuous solder jet system, a droplet generator vibrates to form a stream of solder droplets; an electrical charge is applied to the droplets and the charged droplets are passed between charged deflection plates which selectively direct the droplets to a target surface or to a catcher system.

SUMMARY OF THE INVENTION

In one aspect, the invention features depositing a selected pattern of solder droplets onto a substrate on which one or more electronic components are to be mounted. There is relative movement between the substrate and a solder ejector along a scan axis. The droplets from the ejector are deflected along a fan axis that is transverse to the scan axis by selectively applying a charge to each droplet and passing the charged droplets through an electric field. The position on the substrate along the scan axis at which a droplet is placed is determined by the relative position of the substrate with respect to the ejector at the time at which a charge is applied, and the position of the droplet along the transverse fan axis is determined by the magnitude of the charge applied to the droplet. The substrate can be moved or the ejector can be moved to provide the relative movement along the scan axis.

In preferred embodiments, the substrate is continuously moved along the scan axis, which avoids delays that would otherwise be introduced by moving the substrate step-wise and reduces the time taken to deposit the pattern of solder droplets. In order to permit placing of droplets on a substrate axis (i.e., in a row, which might very well be parallel to a substrate edge and might otherwise be oriented parallel to the fan axis), the substrate axis is oriented at an acute operating angle with respect to the fan axis.

The components generating the electric field (e.g., plates) can be rotatable about an axis which is normal to the substrate in order to orient the substrate with respect to the fan axis by rotating the fan axis with respect to the scan axis. Alternatively, the substrate can be mounted at an angle with respect to the scan axis on its movable support in order to adjust the angle between the substrate axis and the fan axis.

Preferably the pattern of solder droplets is defined by coordinate pattern data (e.g., CAD data) referenced with respect to the substrate, and these data are transformed to coordinate pattern data referenced with respect to a substrate support. The coordinate pattern data, which are generally referenced with respect to perpendicular axes, are also transformed to angle-adjusted coordinate pattern data according to the acute operating angle.

The acute operating angle is desirably determined by transforming the coordinate pattern data to angle-adjusted coordinate pattern data for a plurality of potential acute operating angle values, determining positions of droplets and spacings between droplets along the scan axis for angle-adjusted coordinate pattern data for each of the potential acute operating angle values, and selecting the acute operating angle from the plurality of potential acute operating angle values based upon the spacings between droplets. By selecting the operating angle that has the largest value for the smallest spacing between two droplets, the permitted velocity along the scan axis can be maximized to minimize processing time. In addition, the spacings along the scan axis can be increased (with a corresponding increase in velocity) by adjusting the scan axis position values for the angle-adjusted data to accommodate an allowable error for placement of each droplet; the allowable error is determined by the difference between the user-specified maximum error for placing droplets and the significantly smaller maximum error of the printing equipment.

After selecting an acute operating angle, the angle-adjusted coordinate pattern data are used to control when charges are applied to the solder droplets being ejected and to control the magnitude of the charges.

In another aspect the invention features depositing a selected pattern of solder droplets onto a substrate by directing molten solder droplets from a solder ejector through an electrical field, selectively applying charges to the solder droplets prior to passage through the field in order to control deflection of the solder droplets to a desired position along a fan axis, and creating relative movement between the substrate and the fan axis. In some embodiments the fan axis is moved (e.g., by rotating plates providing the field with the ejector either fixed or rotatable) and in some others the substrate is moved (e.g., rotated). Preferably the relative motion is continuous.

Other features and advantages of the invention will become apparent from the following description of preferred embodiments and from the claims.

DESCRIPTION OF THE PREFERRED EMBODIMENTS

Figure 1:
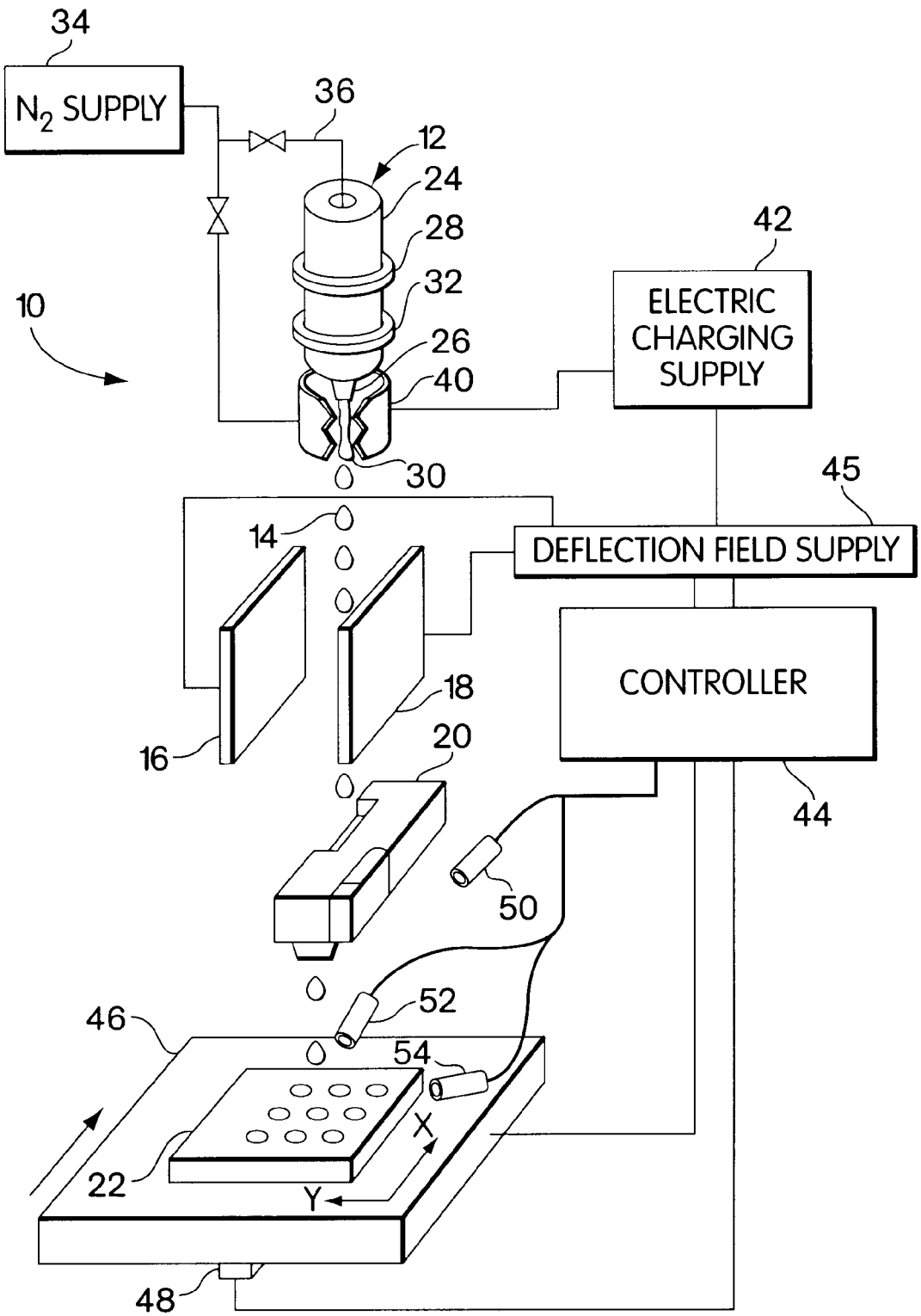
FIG. 1 is a diagrammatic perspective view of a jet soldering system for depositing solder droplets onto a substrate.

Referring to FIG. 1, jet soldering system 10 includes a solder ejector 12 for providing a continuous stream of charged solder droplets 14 and deflection plates 16, 18 for passing the charged solder droplets through to a gutter 20 or deflecting the droplets toward a substrate 22, on which one or more semiconductor IC chips are to be mounted. Solder ejector 12 is shown diagrammatically in FIG. 1; an example of an ejector that can be used is described in U.S. Ser. No. 08/533,508, filed Sep. 25, 1995. Solder ejector 12 includes a replaceable solder cartridge 24 having an orifice defining structure 26 at its bottom and an electromechanical vibrator 28 (a piezoelectric crystal vibrator) to vibrate the orifice defining structure 26, producing a standing wave in the stream of solder 30 leaving the ejector that controls droplet formation. Heaters 32 melt solder contained within the replaceable solder cartridge. A supply 34 delivers nitrogen gas (or other inert gas such as argon) along a gas line 36 to pressurize the cartridge to control the formation of solder droplets leaving the ejector. Nitrogen (or other inert gas such as argon) is also supplied via line 38 to a laminar flow producing structure 40 (shown partially broken away in FIG. 1) to provide a laminar flow of inert gas around droplets 14. The inert gas is high purity gas such as research grade or better. A droplet charging supply 42 is electrically connected to a conductive ring (not shown) around stream 30 so that a charge is selectively applied to the solder droplets 14 on a droplet-by-droplet basis at the instant that they break from stream 30.

Solder droplets 14, formed by ejector 12, are directed to pass between deflection plates 16, 18. Controller 44 controls the bias applied to deflection plates 16, 18 by deflection power supply 45. Controller 44 is coupled to linear x-y translation table 46, on which substrate 22 is mounted. A position indicator 48 provides signals to the controller for precisely coordinating the position of translation table along the X axis. Camera 50 (including a vision system to identify objects) images substrate 22 on x-y table 46 and solder droplets 14 deposited on substrate 22 so that controller 44 can coordinate the position of substrate 22 on the x-y table and calibrate the extent of droplet deflection caused by charging supply 42 and plates 16, 18. During a deposition run, table 46 is moved along the X axis, and the charge on each droplet 14 controls whether the solder droplet 14 is passed undeflected to gutter 20 or is deflected toward substrate 22 along a "fan axis" that is perpendicular to plates 16, 18 and transverse to the X axis. The magnitude of the charge determines the extent of deflection along the fan axis. In this way, the droplets can be directed in two axes to any desired location on the substrate surface. For substrates having a width that is greater than the deflection along the fan axis, different areas could be covered in multiple scans along the X axis, with the table being translated to a different position along the Y axis between scans.

Vibrator 28 is biased with a periodic waveform with a magnitude of about 50–300 V and a fundamental frequency (f) of about 12,000 Hz, which corresponds to:

$$f=(k \times V)/2\pi r_o$$

where:
  k is a constant that varies between 0.4 and 0.8,
  V is droplet velocity, and
  $r_o$ is orifice radius.
E.g., a 100 micron diameter orifice will require a frequency f of about 12,000 Hz, where V is approximately 5 meters/second. Of course, 12,000 Hz is merely an example, and other frequencies can be used.

In operation, controller 44 causes table 46 to move along the X axis and deflection field supply 45 to charge deflection plates 16, 18 (FIG. 1) to deflect charged droplets 14 passing therebetween so that charged droplets are selectively deflected along the fan axis to the desired position on the substrate or passed through to the collection gutter, based on the position of the substrate and the desired pattern of deposited solder droplets. After droplets have been deposited onto the substrate in a selected pattern, the substrate is removed from the x-y translation table.

To permit printing of a board in a minimum time, it is desirable to continuously move the table, and the board on it, in the scan direction, i.e., along the X axis. This, however, prevents one from depositing droplets at a plurality of locations that have the same X axis coordinate but different fan axis coordinates. E.g., if the fan axis were perpendicular to the X axis, i.e., the Y axis, and the pattern of solder locations included a row having the same X axis coordinate but different Y axis coordinates, only one droplet 14 could be deposited, because table 46, and substrate 22 on it, move in the time between droplets, namely 1/(12,000 Hz) or 0.00083 second, assuming a frequency of 12,000 Hz.

Figure 2:
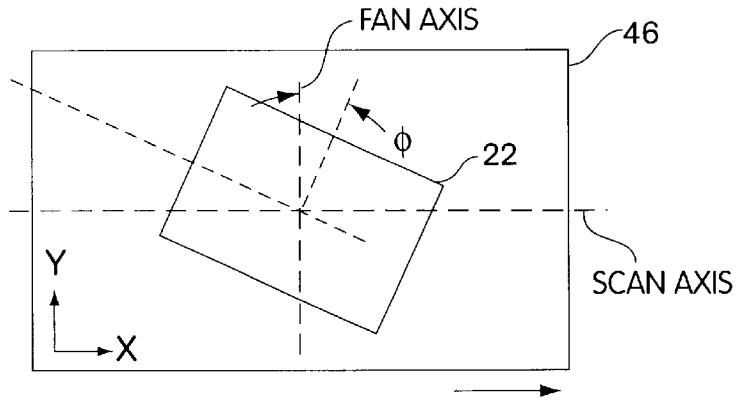
FIG. 2 is a diagrammatic plan view of a substrate oriented at an offset angle relative to the motion of a substrate translation table.
Figure 3:
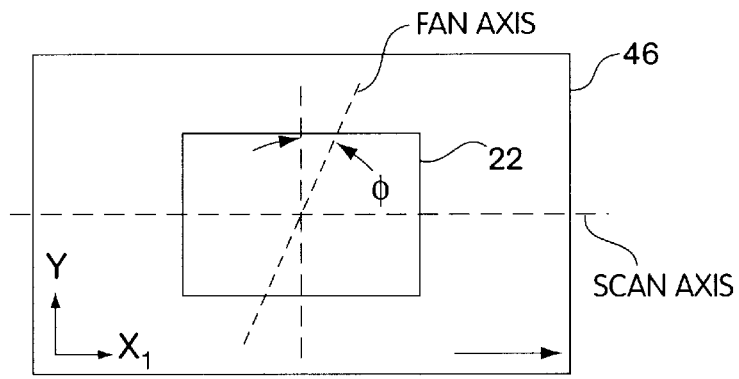
FIG. 3 is a diagrammatic view showing a fan axis for deflecting solder droplets in the FIG. 1 system oriented at an offset angle relative to the motion of the translation table.

In order to deposit droplets 14 on substrate 22 at locations along such axes, the relative orientation of substrate 22 and the droplet fan axis are adjusted. FIG. 2 illustrates keeping the fan axis on the Y axis and rotating substrate 22 by an off-set angle (φ) relative to the direction of table translation along the scan axis, i.e., the X axis, to make the adjustment to orientation. In FIG. 3, substrate 22 is aligned with the direction of table translation, and deflection plates 16, 18 are rotated at a fixed angle (φ) away from the Y axis (90° relative to the direction of table motion) to achieve the same result. The angle φ can typically be adjusted with an accuracy of ±0.01°. It is in general preferable to rotate the fan axis so that the direction of traverse (along the scan axis) can be selected independent of the traverse speed.

The angle φ is selected for a given pattern of solder pads on a substrate 22 so that, at any given position of table 46 in its travel along the X axis, there is only one solder droplet 14 that needs to be deposited along the transverse fan axis. In addition, the angle φ is selected so that the distance that table 46 moves between any two droplets being deposited on substrate 22 is maximized, thereby permitting table 22 to be moved at the highest possible speed while still depositing all droplets 14 that need to be deposited. Soldering system 10 is capable of depositing solder droplets at a higher accuracy than generally required by user manufacturing specifications, and the excess allowable error in solder droplet location is used to slightly redefine the user-specified locations for droplets 14, in order to adjust the positions of droplets 14 so as to space them along the X axis and thereby permit increased table velocity, as is discussed below.

Figure 4:
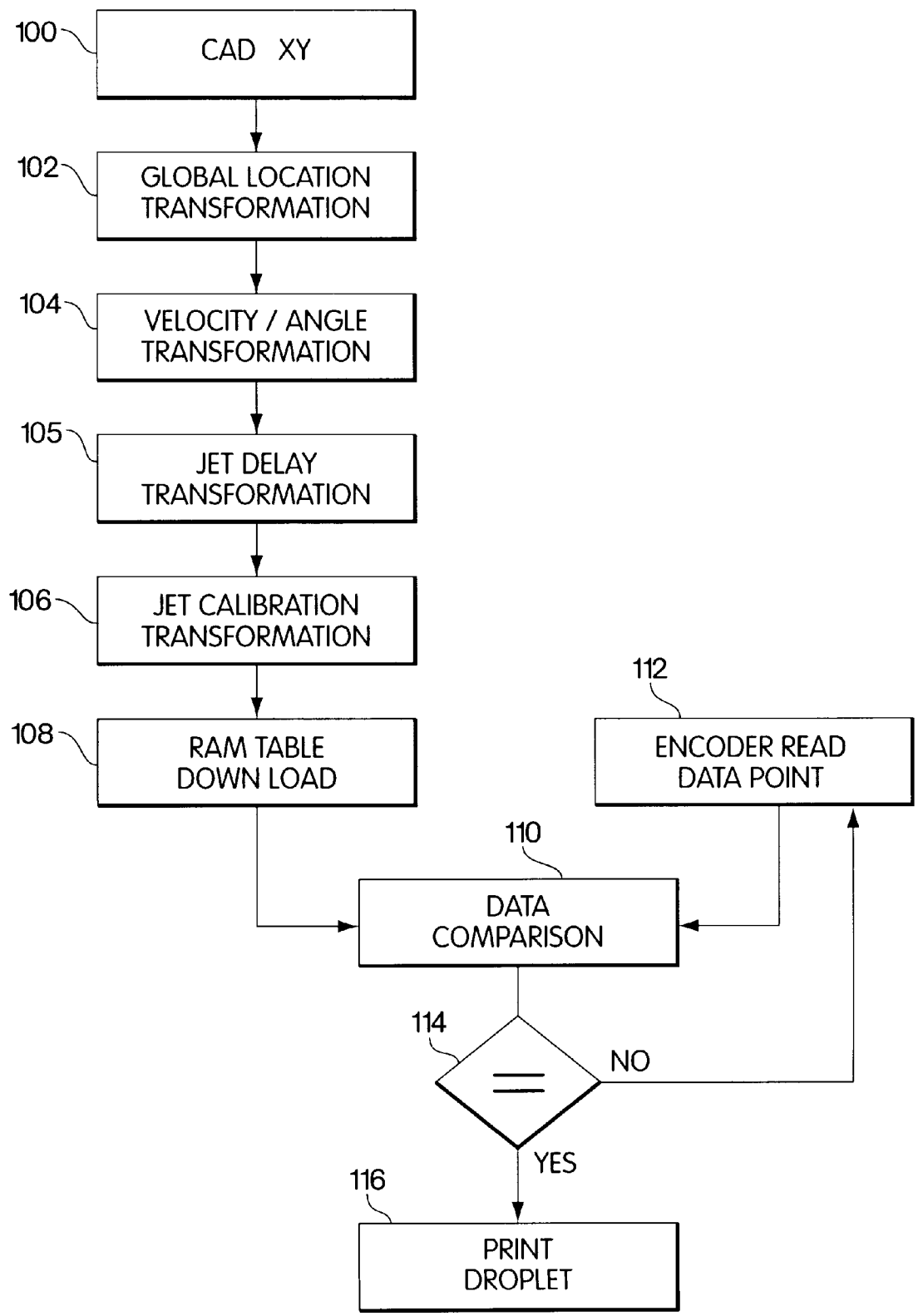
FIG. 4 is a flow chart showing a method of determining an optimum offset angle and depositing solder droplets at the offset angle.

FIG. 4 is a flow diagram that shows the steps involved in processing the raw computer aided design (CAD) data for user-specified solder pad locations on substrate 22. The CAD droplet position data are used to select the desired deflection plate offset angle and maximum table velocity, and to control the actual deposition of solder droplets by apparatus 10. In step 100, the CAD droplet position data are accessed. In step 102, the CAD droplet position data are subjected to a global transformation for a given substrate 22 that has been loaded and clamped on table 52. This involves moving table 52 along the X and Y axes, and viewing indicia at known positions on substrate 22 with camera 50 in order to determine the relative positions of substrate 22 and x-y table 46. The relative position data are used to transform the droplet positions specified by the raw CAD data into positions on the X-Y coordinate axes for x-y table 46.

Figure 5:
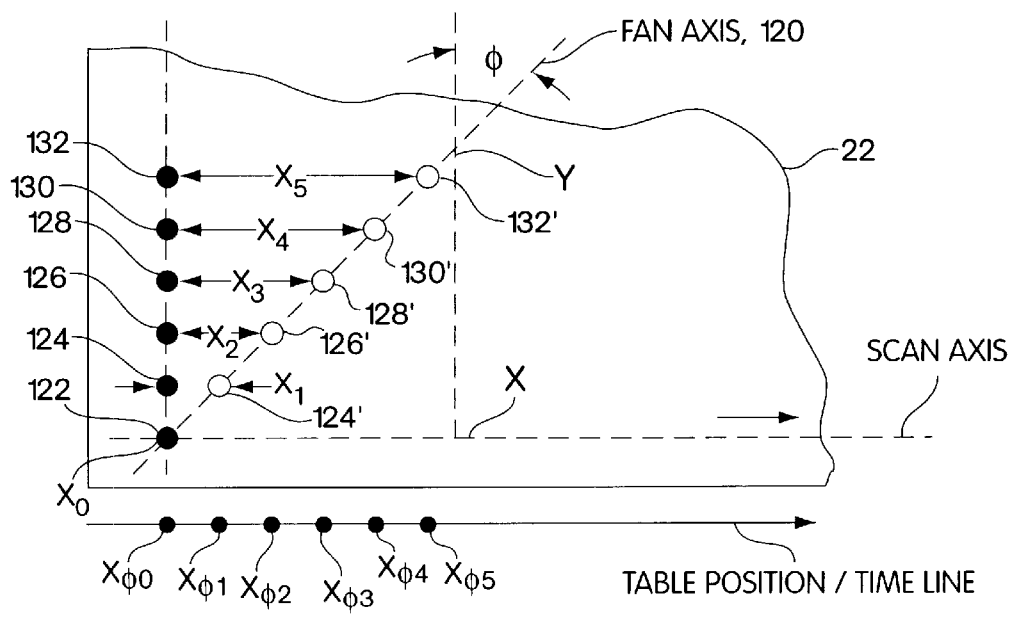
FIG. 5 is an illustration showing how to transform solder droplet coordinate pattern data to account for a fan axis oriented at an offset angle.

Step 104 involves processing the transformed CAD data from step 102 in order to identify the optimum angle and velocity. Appendix A hereto is a software listing for the process, and FIG. 5 illustrates the transformation of the (X, Y) coordinate position data to ($X_\phi$, Y) data that have been skewed to accommodate printing with deflection plates 16, 18 rotated from the Y axis by an angle $\phi$. Thus, FIG. 5 shows fan axis 120 at angle $\phi$ from the Y axis, and shows the X axis with a location $X_0$ at the intersection with the fan axis. (On FIG. 5, the X and Y axes are shown shifted from the positions shown in FIGS. 1–3 for purposes of illustration.) Table movement on FIG. 5 is to the right; thus in effect the X, Y coordinate axes move to the right. When table 22 is at the position shown, ejected solder droplet 122 (with a Y value of 0) will be deposited at coordinates $X_0$, 0. Solder droplets 124, 126, 128, 130, 132, also have X values of $X_0$, but Y values of $Y_1$, $Y_2$, $Y_3$, $Y_4$, and $Y_5$; they thus will not be printed until table 22 has moved to the right by the amounts $X_1$, $X_2$, $X_3$, $X_4$, and $X_5$, so that the locations are intersected by the skewed fan axis 120, as indicated by the circles 124', 126', 128', 130', and 132'. Because table 22 is moving at a constant velocity, the $X_1$–$X_5$ values are directly related to time. The time line below substrate 22 on FIG. 5 shows the time delays as transformed $X_\phi$ values. Thus, droplet 122 is still deposited at time zero with the fan axis at $X_0$; droplet 124 is now deposited at a time corresponding to the table moved distance $X_1$ from $X_0$; droplet 126 is now deposited at a time corresponding to distance $X_2$, droplet 128 is now deposited at a time corresponding to distance $X_3$, and so on. The transformed $X_\phi$ value thus equals the original X value plus the distance $X_i$ that the table travels for the location to be under the fan axis, which is Y*tangent($\phi$). Thus, $$X_\phi = X_{(orig.)} + Y^*tangent.$$

where: $X_{(orig.)}$ is the original X value, and $\phi$ is the angle that the fan axis has been rotated from the Y axis.

It will be appreciated that, depending on the angle $\phi$ and the pattern of desired locations of droplets 114 on substrate 22, droplets with higher $X_{(orig.)}$ values (e.g., there could be multiple vertical rows of droplets 114) can in many cases be deposited before droplets with smaller $X_{(orig.)}$ values. The optimum angle is determined by varying $\phi$ for all values between 0° and 45° in increments of 0.005*pi. (Other increment values, e.g., smaller than 0.005*pi, could be used.) For each value of $\phi$, the following steps are carried out.

Step A. $X_\phi$ values are calculated for all solder droplet positions in the pattern and are sorted to arrange them in order of increasing $X_\phi$ value. This shows spacing along the X axis between droplets. In general, if two droplets have the same $X_\phi$, this angle $\phi$ cannot be used. The smallest distance between any two adjacent droplets on the time line will be the limiting factor on use of a high velocity, as the velocity cannot go above this distance divided by the time between consecutive ejected droplets, namely 0.000083 seconds (assuming a 12,000 Hz frequency).

Step B. The $X_\phi$ values are adjusted to space them out along the X axis to use up excess error, namely user specified permitted error minus the error budget of system 10. E.g., if the user requires placement to within 0.0005" and apparatus 10 can place the droplets to within 0.0001", there is excess allowable error of up to 0.0004" that can be used to adjust each $X_\phi$ value to the left or the right so that the smallest spacing between any two $X_\phi$ values is increased as much as possible. This is done by an iterative procedure that involves making adjustments to three $X_\phi$ values at a time, moving the middle value to the midpoint between the other two to the extent permitted by allowable error, and moving over one value to make adjustments to a new group of three values. This is carried out back and forth across the time line until the smallest spacing between two adjacent values has been increased as much as possible to the extent permitted by allowable error.

Step C. The distance d between the closest two $X_\phi$ values is calculated. This is the limiting factor on velocity.

Step D. The maximum table velocity, V, is calculated by dividing d by the time between each droplet, which, for f=12,000 Hz is 0.000083 seconds. Thus, $$V=d/(0.00008).$$

Step E. Compare V for this $\phi$ with the prior highest stored V calculated for prior values of $\phi$, and store the $\phi$ and V for the maximum V.

The angle $\phi$ is incremented by 0.005*pi, and steps A–E are repeated, and this is continued until all angles between 0° and 45° have been evaluated. The stored $\phi$ (from steps E) at the end of the evaluation of all angles is the one having the highest velocity, and it is used. Steps A–B are then repeated for this angle $\phi$ to regenerate the $X_\phi$ values to be used, and this completes the velocity/angle transformation step 104 of FIG. 4. The Y values remain unchanged (though the actual amount of deflection along the fan axis and charge used to achieve the deflection are functions of the angle $\phi$), and deflection plates 16, 18 are rotated to cause the fan axis to be at the angle $\phi$ from the Y axis.

In step 105 (FIG. 4), the $X_\phi$ values are adjusted to account for the fact that table 46 moves by a certain amount in the time it takes a charged droplet 14 that has broken away from stream 30 ejected from the orifice to reach substrate 22.

In step 106, the controls for deflecting droplets by charging individual particles and subjecting them to the field between plates 16, 18 are calibrated. This is done by depositing a pattern of droplets 14 at varying charge values and examining where the droplets 14 land with camera 50. The droplets may be deposited at other than intended locations along the fan axis, and in also might not lie precisely on the fan axis. The $X_\phi$ and Y values are adjusted accordingly. Step 106 can be, and preferably is, carried out before any other steps. Cameras 52, 54 can be used to verify actual position of droplets shortly before or during a run and to indicate whether there is a need to recalibrate.

In step 108, the position data used for print control, namely the angle-adjusted coordinate values ($X_\phi$, Y) from step 106, are loaded into a RAM table ready for use in print control.

During the deposition process, as table 46 moves along the X axis, position indicator 48 outputs a stream of data indicating the position along the X axis aligned with the fan axis. (Step 112). These values are compared with the $X_\phi$ values in the RAM table (step 114); when there is a match, the associated Y value is used to determine the charge applied to the droplet 14 being formed.

Droplets 14 are ejected at specific times that are integer multiples of the period between vibrations; these specific times are associated with locations along the X axis that are integer multiples of the minimum spacing value. The $X_\phi$ values might not coincide exactly the discrete locations for droplets, but differences in value are accounted for in the system error used in determining allowable error. The charges are applied at the precise times that the drops are breaking away.

At the times when there is no match of position indicator data with stored $X_\phi$ values, the droplets pass undeflected into gutter 20.

Other embodiments of the invention are within the scope of the claims. E.g., in place of the technique described in FIGS. 4 and 5 to determine an operating angle for the fan axis, other techniques can be used to determine an operating angle. In addition to maximization of table velocity, other factors, such as reduction in overall print time for the task at hand, could be considered in selecting an optimum operating angle for the fan axis. Also, whatever technique is used can be modified to account for specific sources of errors of significant magnitude. In particular, droplets with high charge, e.g., ones deflected to large distances along the fan axis, can have significant repulsive forces on droplets ejected immediately before or after them. If not avoided, the resulting error in placement of a drop can be significant. One technique to reduce such error is to keep droplet charges below a maximum specified level by limiting the distance deflected along the fan axis; where this limits the width of the path covered along the scan axis to less than the width of a substrate, multiple scans can be carried out, with the x-y table shifted by an appropriate amount along the Y axis between scans. Another technique is to impose a condition, at the time, e.g., of adjusting for allowable error on the time line in FIG. 5 (step B within step 104 of FIG. 4), to require minimum spacing between any two adjacent droplets (or any two droplets that otherwise would be at some close spacing) as a function of the charges of the two droplets so that the repulsive forces are kept to below a required level.

In addition, the ejector could be moved while the substrate is stationary to provide a relative movement along a scan axis. Also, the scanning movement could be rotatable instead of linear. Thus, the fan axis could be rotated (continuously or in steps) by rotating plates 16, 18 (with the ejector fixed or rotatable) while droplets are deflected along the fan axis to deposit a pattern of droplets. Alternatively, the substrate could be rotated (continuously or in steps) on a rotatable work table. In both cases there is relative movement between the fan axis and the substrate in order to place droplets at any desired location.

What is claimed is:

1. A method of depositing a selected pattern of solder droplets ejected from an ejector of an ejection system onto a substrate on which one or more components are to be mounted, the method comprising steps of:

creating relative movement between the substrate and the ejector along a scan axis;

directing solder droplets from said ejector through an electric field; and selectively applying charges to said solder droplets prior to passage through said field in order to control deflection of said solder droplets to a desired position on said substrate, said solder droplets being deflected along a fan axis that is transverse to said scan axis;

wherein the step of selectively applying charges includes a step of calibrating the ejection system using a vision detection system to determine an amount of deflection of the solder droplets for a specific charge value.

2. The method of claim 1 wherein said substrate is moved along said scan axis.

3. The method of claim 1 wherein said ejector is moved along said scan axis.

4. The method of claim 1 wherein:

said substrate has a substrate axis on which the solder droplets are to be deposited, and said substrate is oriented with respect to said fan axis so that said substrate axis makes an acute operating angle with said fan axis to permit solder droplets to be deflected along said fan axis and deposited on said substrate axis while there is continuous relative movement between said substrate and said ejector along said scan axis.

5. The method of claim 4 wherein said electrical field is provided by deflection elements that are rotatable about an axis which is normal to the substrate in order to orient said substrate with respect to said fan axis.

6. The method of claim 4 wherein said substrate is adjustably moved to adjust the angle between said substrate axis and said fan axis.

7. The method of claim 1 wherein said pattern of solder droplets is defined by coordinate pattern data referenced with respect to said substrate, and further comprising transforming said data to coordinate pattern data referenced with respect to a substrate support on which said substrate is mounted.

8. The method of claim 4 wherein said pattern of solder droplets is defined by coordinate pattern data referenced with respect to perpendicular axes, and further comprising transforming said coordinate pattern data to angle-adjusted coordinate pattern data according to said acute operating angle.

9. The method of claim 8 further comprising determining said acute operating angle by transforming said coordinate pattern data according to angle-adjusted coordinate pattern data according to an acute operating angle for a plurality of potential acute operating angle values, determining positions of droplets and spacings between droplets along said scan axis for angle-adjusted coordinate pattern data for each of said potential acute operating angle values, and selecting said acute operating angle from said plurality of potential acute operating angle values based upon said spacings between droplets.

10. The method of claim 9 wherein said determining spacings between droplets includes adjusting scan axis position values to accommodate an allowable error for placement of each droplet so as to increase the smallest spacing along the scan axis between any two droplets.

11. The method of claim 9 wherein said selecting involves, for each potential acute operating angle, identifying the smallest spacing along the scan axis between any two droplets.

12. The method of claim 11 wherein said selecting involves identifying the potential acute operating angle that has the largest value for its smallest spacing along the scan axis between any two droplets.

13. The method of claim 8 further comprising using said angle-adjusted coordinate pattern data to control said selectively applying charges to said solder droplets.

14. The method of claim 13 further comprising:

generating a scan signal indicating the position of said substrate along said scan axis by monitoring the position of said substrate relative to said ejector, and comparing the scan signal with said angle-adjusted coordinate pattern data to determine the magnitude of a charge to be applied to a solder droplet and when it should be applied to deposit a solder droplet to the desired position on said substrate.

15. The method of claim 4 wherein said solder droplets are ejected as a stream of droplets.

16. A method of depositing a selected pattern of solder droplets ejected from an ejector of an ejection system onto a substrate on which one or more components are to be mounted, the method comprising steps of:

directing solder droplets from said ejector through an electrical field;

selectively applying charges to said solder droplets prior to passage through said field in order to control deflection of said solder droplets to a desired position along a fan axis, and creating relative movement between the substrate and said fan axis;

wherein the step of selectively applying charges includes a step of calibrating the ejection system using a vision detection system to determine an amount of deflection of the solder droplets for a specific charge value.

17. The method of claim 16 wherein said fan axis is moved to create said relative movement.

18. The method of claim 17 wherein said fan axis is rotated.

19. The method of claim 18 wherein said fan axis is moved relative to said ejector.

20. The method of claim 16 wherein said substrate is moved to create said relative movement.

21. The method of claim 20 wherein said substrate is rotated.

22. The method of claim 16 wherein said relative movement is continuous.

* * * * *